(12) United States Patent
Malevsky et al.

(10) Patent No.: US 11,101,771 B2
(45) Date of Patent: Aug. 24, 2021

(54) CRYSTAL OSCILLATOR AND ELECTRONIC DEVICE USING THE CRYSTAL OSCILLATOR

(71) Applicant: Intel Corporation, Santa Clara, CA (US)

(72) Inventors: Sharon Malevsky, Tel-Aviv (IL); Ofer Gueta, Ganei-Tikva (IL); Tomer Gidoni, Petach Tikva (IL)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 16/587,113

(22) Filed: Sep. 30, 2019

(65) Prior Publication Data

US 2020/0136557 A1 Apr. 30, 2020

Related U.S. Application Data

(60) Provisional application No. 62/751,730, filed on Oct. 29, 2018.

(51) Int. Cl.
*H03B 5/32* (2006.01)
*H03K 5/01* (2006.01)
*H03K 5/00* (2006.01)

(52) U.S. Cl.
CPC ........... *H03B 5/32* (2013.01); *H03K 5/00006* (2013.01); *H03K 5/01* (2013.01); *H03B 2200/0088* (2013.01)

(58) Field of Classification Search
CPC .... H03B 5/32; H03B 2200/0088; H03K 5/01; H03K 5/00006
See application file for complete search history.

(56) References Cited

U.S. PATENT DOCUMENTS

2005/0007205 A1* 1/2005 Bridger .................. H03B 5/368
331/108 C

OTHER PUBLICATIONS

Guillermo Gonzalez: "Foundations of oscillator circuit design", 2007 Artech House, Inc.

* cited by examiner

*Primary Examiner* — Jeffrey M Shin
(74) *Attorney, Agent, or Firm* — 2SPL Patent Attorneys PartG mbB; Yong Beom Hwang (57) ABSTRACT

A crystal oscillator is provided. The crystal oscillator includes a crystal resonator including a pair of terminals and being capable of oscillating at a fundamental resonance frequency and at least one overtone resonance frequency. Further, the crystal oscillator includes an inverter circuit coupled between the pair of terminals. The crystal oscillator additionally includes a suppression circuit configured to suppress oscillation of the crystal resonator at the fundamental resonance frequency. Further, the crystal oscillator includes a control circuit configured to control a switch circuit for selectively coupling the suppression circuit to the crystal resonator.

17 Claims, 4 Drawing Sheets

CRYSTAL OSCILLATOR AND ELECTRONIC DEVICE USING THE CRYSTAL OSCILLATOR

CROSS-REFERENCE TO RELATED APPLICATION

This application claims the benefit of U.S. Provisional Application 62/751,730 filed on Oct. 29, 2018. The contents of the earlier filed application is incorporated by reference herein in its entirety.

FIELD

The present disclosure relates to oscillators. In particular, the present disclosure relates to a crystal oscillator and an electronic device using the crystal oscillator.

BACKGROUND

In electronic devices, a crystal oscillator (XO) block is responsible for generating and distributing analog and digital reference clocks required for all internal and external modules.

Its quality and current consumption are two of the most important Key Performance Indicators (KPIs). With increasing demand for higher modulation schemes, throughput and output power, reference clock jitter requirements become more stringent. For example, as modern communication evolves towards more complex constellations, higher bandwidths and throughput, XO jitter specifications are hardened. Thus, higher current has to be invested to improve the oscillator and shaper noise performance. On the other hand, the power KPIs of legacy rates or low modulation schemes are degraded, which renders them less competitive, especially for battery powered platforms or mobile handsets.

Hence, there may be a desire for improved clock (oscillation) signal generation.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
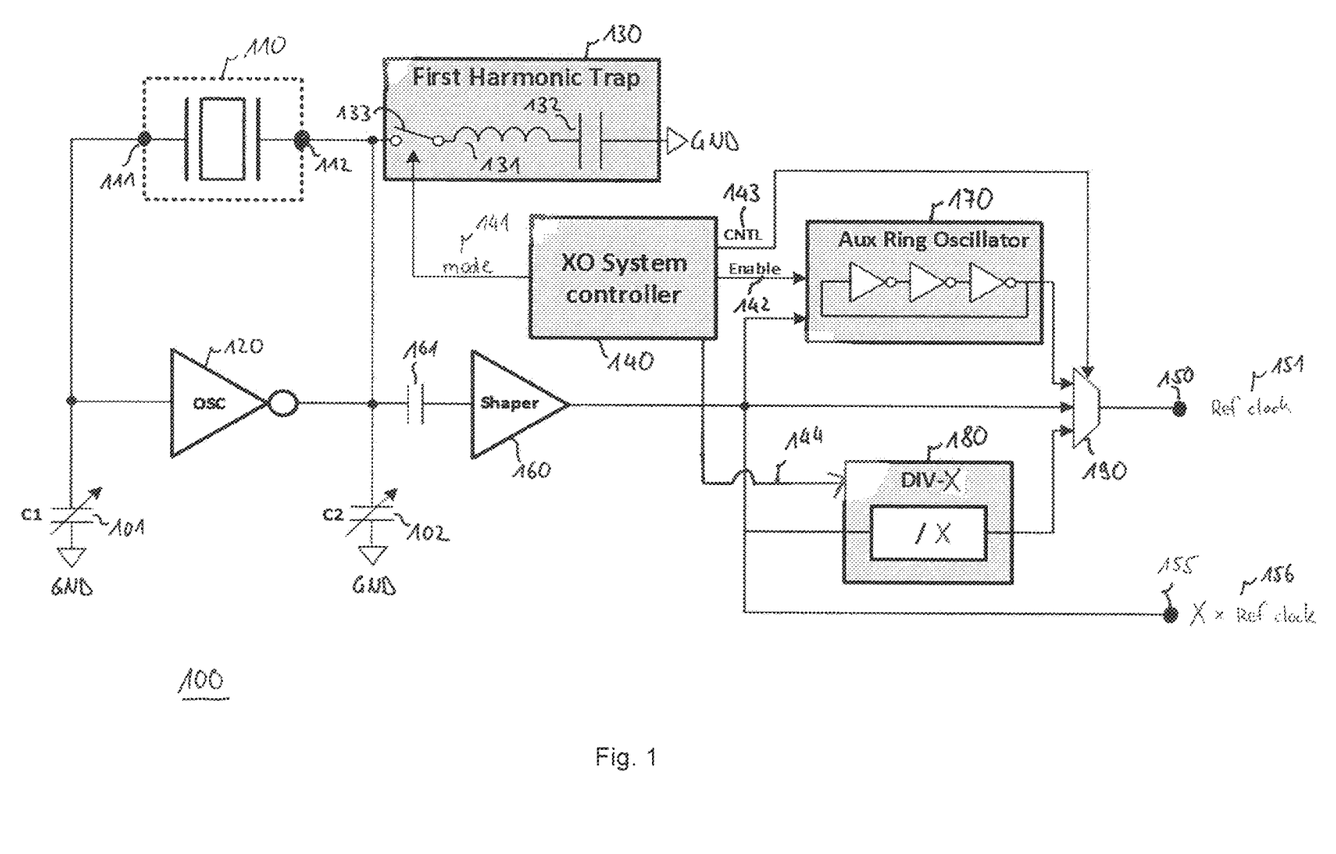
FIG. 1 illustrates an example of a crystal oscillator.

FIG. 1 illustrates a crystal oscillator 100. The crystal oscillator 100 comprises a crystal (quartz) resonator 110. The crystal resonator 110 comprises a pair of terminals 111 and 112 for coupling the crystal resonator 110 to other circuitry.

Figure 2:
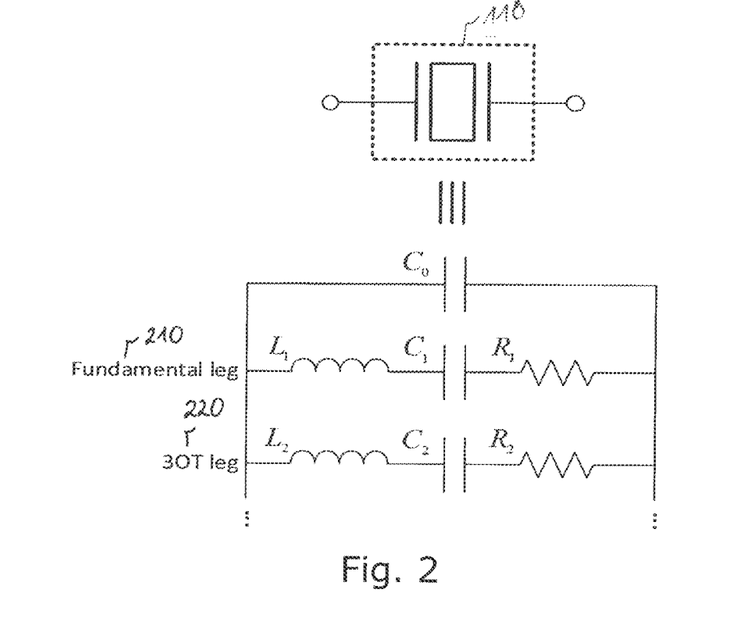
FIG. 2 illustrates an example of a crystal resonator model.

The crystal resonator 110 is capable of oscillating (resonating) at a fundamental resonance frequency and at least one (odd) overtone resonance frequency (the at least one overtone resonance frequency may, e.g., be the third overtone resonance frequency). A crystal resonator in general exhibits several series resonances. An exemplary model of the crystal resonator 110 is illustrated in FIG. 2. The individual resonance frequencies of the crystal resonator 110 are modelled as series-resonant branches 210, 220, . . . coupled in parallel. The first branch 210 (comprising a first inductance $L_1$, a first capacitance $C_1$ and a first resistance $R_1$) models the fundamental mode of oscillation, i.e. the oscillation mode generating the fundamental resonance frequency of the crystal resonator 110. The second branch 220 (comprising a second inductance $L_2$, a second capacitance $C_2$ and a second resistance $R_2$) models the oscillation mode generating the third overtone resonance frequency of the crystal resonator 110. The third overtone resonance frequency is (substantially) three times the fundamental resonance frequency.

As indicated in FIG. 2, further series-resonant branches may model higher odd overtone resonance frequencies of the crystal resonator 110 (e.g. fifth overtone resonance frequency, seventh overtone resonance frequency, etc.). The fundamental resonance and its odd overtones are also known as "harmonics" of the crystal resonator 110. Hence, the fundamental resonance frequency may be understood as a first harmonic, the third overtone resonance frequency may be understood as a third harmonic, etc.

Figure 3:
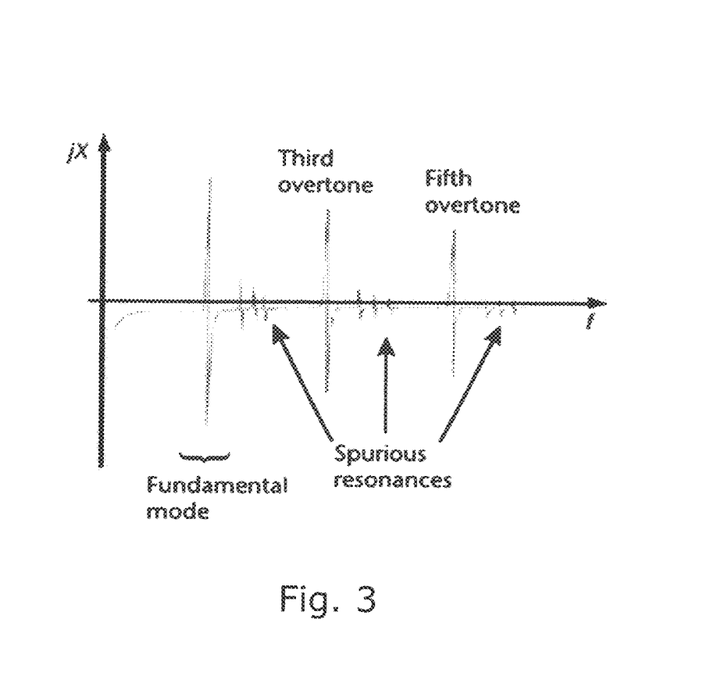
FIG. 3 illustrates an example of a crystal resonator reactance characteristic.

FIG. 3 illustrates an exemplary reactance characteristic of the crystal resonator 110. As can be seen from FIG. 3, the gain is highest for the fundamental resonance frequency and decreases with increasing order of the overtones.

Referring back to FIG. 1, an inverter circuit 120 is coupled between the pair of terminals 111 and 112 for inverting the output of the crystal resonator 110. That is, an input terminal of the inverter circuit 120 is coupled to one of the pair of terminals 111 and 112 (terminal 111 in FIG. 1), and an output terminal of the inverter circuit 120 is coupled to the other one of the pair of terminals 111 and 112 (terminal 112 in FIG. 1). In other words, an (external) crystal quartz resonator is coupled in parallel to an inverter for generating the negative resistance for the oscillation.

The crystal oscillator 100 additionally comprises a suppression circuit 130 configured to suppress oscillation of the crystal resonator 110 at the fundamental resonance frequency. The suppression circuit 130 is configured to shunt signal components output by the crystal resonator 110 at the fundamental resonance frequency to ground.

Further, the crystal oscillator 100 comprises a switch circuit 133 (e.g. a semiconductor switch) for selectively coupling the suppression circuit (or a first harmonic trap) 130 to the crystal resonator 110. Although the switch circuit 133 is depicted inside the box representing the suppression circuit 130 in FIG. 1, it is to be noted that the switch circuit 133 need not be part of the suppression circuit 130. However, in some examples, the switch circuit 133 may be part of the suppression circuit 130.

A control circuit 140 of the crystal oscillator 100 is configured to control the switch circuit 133 (via a first control signal 141) for selectively coupling the suppression circuit 130 to the crystal resonator 110. In other words, the suppression circuit 130 may be coupled to or decoupled from the crystal resonator 110 under control of the control circuit 140. For example, the control circuit 140 may be configured to control the switch circuit 133 to decouple the suppression circuit 130 from the crystal resonator 110 in a first operation mode, and to couple the suppression circuit 130 to the crystal resonator 110 in a second operation mode. Accordingly, the crystal resonator 110 may be selectively controlled to not oscillate at the fundamental frequency. For shunting the signal components at the fundamental resonance frequency to ground, the suppression circuit 130 comprises an inductive element 131 and a capacitive element 132 coupled between the switch circuit 133 and ground. The inductance of the inductive element 131 and the capacitance of the capacitive element 132 are selected in accordance with the fundamental resonance frequency of the crystal resonator 110.

When the suppression circuit 130 is decoupled from the crystal resonator 110, the crystal resonator 110 will substantially operate (resonate) only at the fundamental resonance frequency since the gain for the fundamental oscillation mode (i.e. the first harmonic) is higher than for the higher order harmonics (e.g. see FIG. 3). On the other hand, when the suppression circuit 130 is coupled to the crystal resonator 110, resonation of the crystal resonator 110 at the fundamental oscillation mode is suppressed such that the crystal resonator 110 will substantially operate (resonate) only at the third overtone resonance frequency (i.e. at the third harmonic).

Therefore, the control circuit 140 and the switch circuit 133 may enable to operate the crystal resonator 110 at two different resonance frequencies (tones). For example, the lower fundamental resonance frequency may be used by other circuitry for power efficient operation, whereas the third overtone resonance frequency may be used for high (best) performance operation. The crystal oscillator 100 may allow on-the-fly switching between power efficiency and performance modes. Hence, the crystal oscillator 100 may allow power/performance optimization for electronic devices using the crystal oscillator 100.

In some examples, the suppression circuit 130 may be further configured to suppress resonation of the crystal resonator 110 at one or more overtone resonance frequencies. For example, if the crystal resonator 110 is capable of oscillating at the fundamental resonance frequency, the third overtone resonance frequency and the fifth overtone resonance frequency, the suppression circuit 130 may be configured to suppress the fundamental resonance frequency and the third overtone resonance frequency such that the crystal resonator 110 operates (resonates) only at the fifth overtone resonance frequency while the suppression circuit 130 is coupled to the crystal resonator 110.

The crystal oscillator 100 comprises two output terminals 150 and 155 for the two different resonance frequencies. Both output terminals 150 and 155 are coupled (indirectly via interconnected circuitry) to the inverter circuit 120. The first output terminal 150 is configured to output a first oscillation signal 151 (reference clock signal) based on an output of the inverter circuit 120 during the first operation mode (i.e. when the suppression circuit 130 is decoupled from the crystal resonator 110). Therefore, the first oscillation signal 151 exhibits (oscillates at) substantially the fundamental resonance frequency. The second output terminal 155 is configured to output a second oscillation signal 156 (reference clock signal) based on the output of the inverter circuit 120 during the second operation mode (i.e. when the suppression circuit 130 is coupled to the crystal resonator 110). Therefore, the second oscillation signal 156 exhibits (oscillates at) substantially the overtone resonance frequency (e.g. the third overtone resonance frequency). In other words, the frequency ratio of the first oscillation signal 151 to the second oscillation signal 156 is substantially equal to the ratio of the overtone resonance frequency to the fundamental resonance frequency.

The crystal oscillator 100 further comprises a first capacitive element 101 coupled between ground and a first one of the pair of terminals 111 and 112 (terminal 111 in FIG. 1), and a second capacitive element 102 coupled between ground and a second one of the pair of terminals 111 and 112 (terminal 112 in FIG. 1). A capacitance of at least one of the first capacitive element 101 and the second capacitive element 102 may be adjustable. For example, the capacitances of both of the first capacitive element 101 and the second capacitive element 102 may be adjustable as illustrated in FIG. 1. The capacitive elements 101 and 102 may allow circuit matching for the different frequencies of the crystal resonator 110's output. In other examples, both the first capacitive element 101 and the second capacitive element 102 may exhibit fixed (non-adjustable) capacitances.

Further, a shaper circuit 160 (e.g. a shaper buffer) is capacitively coupled (via capacitive element 161) to the inverter circuit 120. The shaper circuit 160 is configured to rectify an output of the inverter circuit 120 so that circuitry downstream of the shaper circuit 160 (i.e. circuitry coupled to an output terminal of the shaper circuit 160) receives the rectified output of the inverter circuit 120. In the example of FIG. 1, the two output terminals 150 and 155 are coupled to the output terminal of the shaper circuit 160 such that the first oscillation signal 151 and the second oscillation signal 156 are based on the rectified output of the inverter circuit 120.

With the above described configuration, the crystal oscillator 100 may be operated at two different frequencies. In other words, the crystal oscillator 100 may output (provide) oscillation signals 151 and 156 at two different oscillation frequencies (namely the fundamental resonance frequency and the overtone resonance frequency of the crystal resonator 110). The higher oscillation frequency may be used by other circuitry as clock signal for targeting best performance while the lower oscillation frequency may be used by other circuitry as clock signal for targeting power efficiency.

In order to enable a fast and glitch-less transition between the two oscillation frequencies, the crystal oscillator 100 comprises additional circuitry that will be described in the following.

The crystal oscillator 100 further comprises an auxiliary oscillator circuit 170 tuned to the fundamental resonance frequency. In other words, the auxiliary oscillator circuit 170 generates an oscillation signal oscillating at the fundamental resonance frequency. In FIG. 1, the auxiliary oscillator circuit 170 is depicted as ring oscillator since a ring oscillator requires little energy and chip area. However, the auxiliary oscillator circuit 170 is not limited to be a ring oscillator. In general, the oscillator circuit 170 may be any type of controllable oscillator. The auxiliary oscillator circuit 170 can be activated (enabled) by the control circuit 140 via a second control signal 142.

For transitioning between the first operation mode and the second operation mode, the crystal oscillator 100 is operated in a transition mode. In other words, crystal oscillator 100 is operated in the transition mode when transitioning from the first operation mode to the second operation mode, and vice versa.

The control circuit 140 is configured to activate the auxiliary oscillator circuit 170 prior to entering the transition mode such that the auxiliary oscillator circuit 170 is stably aligned to the output of the inverter circuit 120 when entering the transition mode. The auxiliary oscillator circuit 170 comprises an input terminal for receiving the output of the inverter circuit 120. For example, the auxiliary oscillator circuit 170 may be continuously trained by the output of the inverter circuit 120 (i.e. the XO clock) or be activated on demand for a power/latency trade-off.

The first output terminal 150 is configured to output the first oscillation signal 151 based on an output of the auxiliary oscillator circuit 170 during the transition mode. In other words, while the first oscillation signal 151 is based on the output of the shaper circuit 160 (and, hence, on the output of the inverter circuit 120) in the first operation mode, the first oscillation signal 151 is based on the output of the auxiliary oscillator circuit 170 in the transition mode. Since the auxiliary oscillator circuit 170 is tuned to the fundamental resonance frequency, the first oscillation signal 151 oscillates also during the transition mode at the fundamental resonance frequency.

The crystal oscillator 100 additionally comprises a frequency divider circuit 180 configured to divide a frequency of a signal input to the frequency divider circuit 180 by the ratio of the overtone resonance frequency to the fundamental resonance frequency. For example, if the overtone resonance frequency is the third overtone resonance frequency, a signal input to the frequency divider circuit 180 is frequency divided by three. The frequency divider circuit 180 is configured to receive the (shaped) output of the inverter circuit 120. In other words, the frequency divider circuit 180 is fed based on the output of the crystal resonator 110.

Prior to entering the second operation mode from the transition mode, the control circuit 140 is further configured to activate the frequency divider circuit 180 (via a fourth control signal 144). As soon as (once) the frequency divider circuit 180 operates nominally (stably), the control circuit 140 is further configured to deactivate the auxiliary oscillator circuit 170.

The first output terminal 140 is configured to output the first oscillation signal 151 based on an output of the frequency divider circuit 180 instead of the output of the auxiliary oscillator circuit 170 as soon as the frequency divider circuit 180 operates nominally. The frequency divider circuit 180 allows to provide the first oscillation signal 151 at the fundamental resonance frequency for, e.g., low performance clients (circuitry) coupled to the first output terminal 150 of the crystal oscillator 100 simultaneously (in parallel) to the second oscillation signal 156 at the overtone resonance frequency for, e.g., high performance clients (circuitry) coupled to the second output terminal 155 of the crystal oscillator 100. That is, the crystal oscillator allows to output (provide) the first oscillation signal 151 (at the fundamental resonance frequency) and the second oscillation signal 156 (at the overtone resonance frequency) simultaneously in the second operation mode. In the first operation mode, only the first oscillation signal 151 is output by the crystal oscillator 100.

For selecting the source the first oscillation signal 151 is based on, the crystal oscillator 100 comprises a multiplexer circuit 190 coupled to the first output terminal 150. The multiplexer circuit 190 is coupled to the outputs of the shaper circuit 160 (and, hence, the output of the inverter circuit 120), the auxiliary oscillator circuit 170 and the frequency divider circuit 180. The multiplexer circuit 190 allows to selectively couple one of these outputs to the first output terminal 150. The operation of the multiplexer circuit 190 is controlled by the control circuit 140 via a third control signal 143. In other words, the control circuit 140 is configured to control the multiplexer circuit 190 to selectively couple the first output terminal 150 to one of the inverter circuit 120, the auxiliary oscillator circuit 170 and the frequency divider circuit 180.

In the first operation mode, the control circuit 140 controls the multiplexer circuit 190 to couple the first output terminal 150 to the inverter circuit 120 (via the shaper circuit 160) such that the first oscillation signal 151 is based on the output of the inverter circuit 120.

When entering the transition mode from the first operation mode, the control circuit 140 controls the multiplexer circuit 190 to couple the first output terminal 150 to the auxiliary oscillator circuit 170 such that the first oscillation signal 151 is based on the output of the auxiliary oscillator circuit 170 in the transition mode. In the second operation mode, the control circuit 140 controls the multiplexer circuit 190 to couple the first output terminal 150 to frequency divider circuit 180 such that the first oscillation signal 151 is based on the output of the frequency divider circuit 180.

When entering the transition mode from the second operation mode, the control circuit 140 controls the multiplexer circuit 190 to couple the first output terminal 150 to the auxiliary oscillator circuit 170 such that the first oscillation signal 151 is based on the output of the auxiliary oscillator circuit 170 in the transition mode. When entering the first operation mode from the transition mode, the control circuit 140 controls the multiplexer circuit 190 to couple the first output terminal 150 to the inverter circuit 120 (via the shaper circuit 160) such that the first oscillation signal 151 is based on the output of the inverter circuit 120 in the first operation mode.

The auxiliary oscillator circuit 170 is activated in advance to entering the transition mode from the second operation mode such that it operates stably when entering the transition mode from the second operation mode. Therefore, the control circuit 140 is further configured to deactivate (disable) the frequency divider circuit 180 when entering the transition mode from the second operation mode. When entering the first operation mode from the transition mode, the control circuit 140 is further configured to deactivate the auxiliary oscillator circuit 170.

As can be seen from the above description, transitioning from the first operation mode to the second operation is reversed in comparison to transitioning from the second operation mode to the first operation mode.

The control circuit 140 may be a single dedicated processor, a single shared processor, or a plurality of individual processors, some of which or all of which may be shared, a digital signal processor (DSP) hardware, an application specific integrated circuit (ASIC) or a field programmable gate array (FPGA). The control circuit 140 may optionally be coupled to, e.g., read only memory (ROM) for storing software, random access memory (RAM) and/or non-volatile memory. In some examples, control circuit 140 may implement one or more a Finite-State Machines (FSMs) for performing control of the circuitry.

Figure 4:
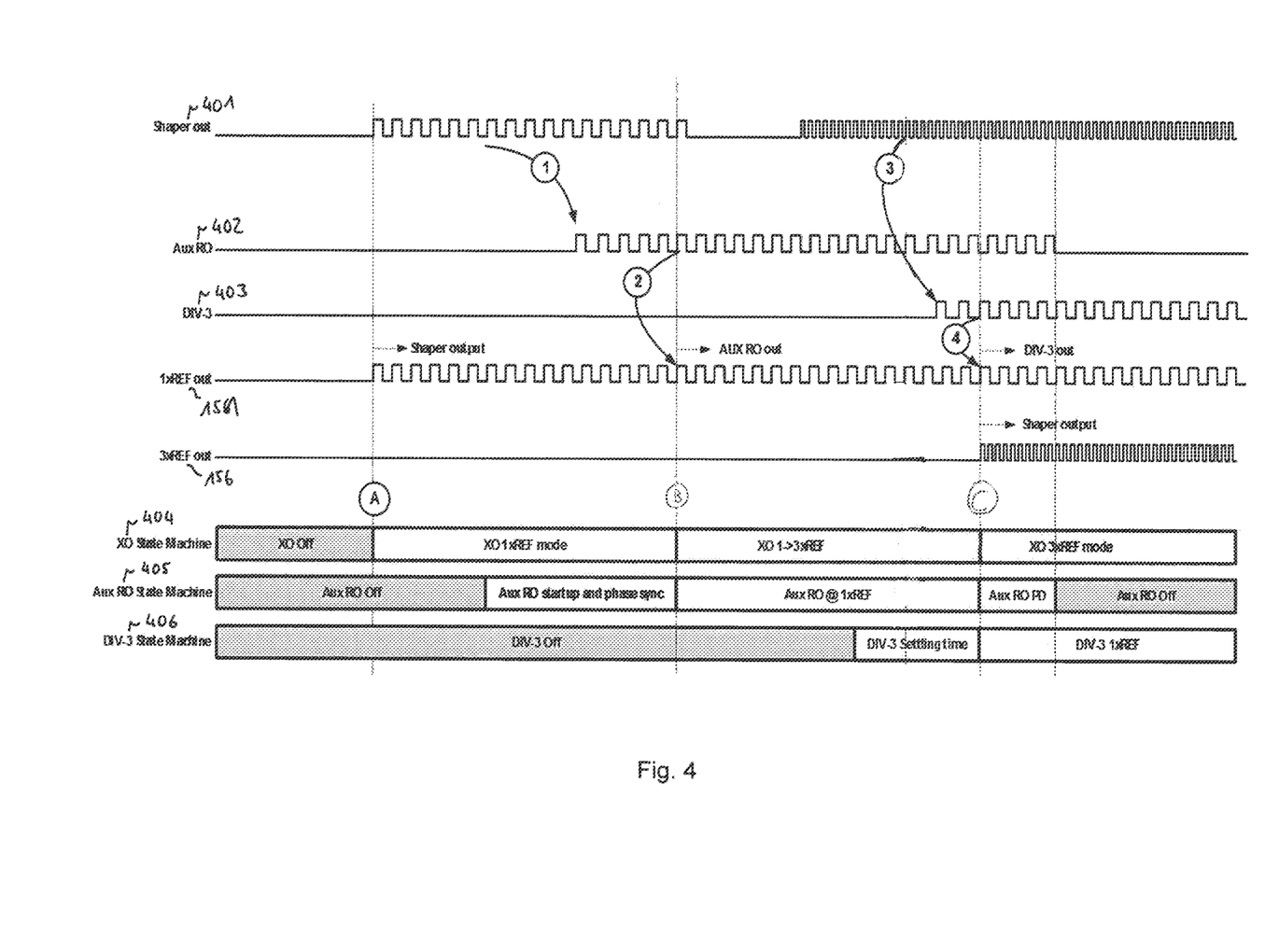
FIG. 4 illustrates an example of a control flow.

An exemplary system flow for transitioning from the first operation mode to the second operation mode is illustrated in FIG. 4. It is assumed in the example of FIG. 4, that the overtone resonance frequency is the third overtone resonance frequency. Further, it is assumed that the control circuit uses a FSM 404 for controlling the operation mode, a FSM 405 for controlling the auxiliary oscillator circuit 170 and a FSM 406 for controlling the frequency divider circuit 180.

In the example of FIG. 4, the crystal oscillator 100 is initially off. Therefore, the FSM 404, the FSM 405 and the FSM 406 are in an off-state (off mode). Accordingly, the output signal 401 of the shaper circuit 160, the output signal 402 of the auxiliary oscillator circuit 170, the output signal 403 of the frequency divider circuit 180 as well as the first oscillation signal 151 and the second oscillation signal 156 are constantly low.

At a time instance A, the crystal oscillator 100 is turned on such that the crystal oscillator 100 is in the first operation mode. Therefore, the FSM 404 transitions to the first operation mode (state). The FSM 405 for the auxiliary oscillator circuit 170 and FSM 406 for the frequency divider circuit 180 remain in the off-state. As described above, the FSM 404 controls the switch circuit 133 to decouple the suppression circuit 130 from the crystal resonator 110 in the first operation mode. Therefore, the crystal resonator 110 resonates only at the fundamental resonance frequency. Accordingly, the output signal 401 of the shaper circuit 160 oscillates at the fundamental resonance frequency. The FSM 404 controls the multiplexer 190 to couple the first output terminal 150 to the shaper circuit 160 such that the first output signal 151 is the output signal 401 of the shaper circuit 160.

Before the FSM 404 transitions from the first operation mode to the transition mode (state), the FSM 405 changes to a start-up state for activating the auxiliary oscillator circuit 170. Upon activation, the auxiliary oscillator circuit 170 starts to align (synchronize) to the output signal 401 of the shaper circuit 160. Once the auxiliary oscillator circuit 170 is stably aligned to the output signal 401 of the shaper circuit 160 at a time instance B, the FSM 404 transitions from the first operation mode to the transition mode. Further, the FSM 405 transitions from the start-up state to a nominal operation state.

When in the transition mode, the FSM 404 controls the multiplexer 190 to couple the first output terminal 150 to the auxiliary oscillator circuit 170 such that the first output signal 151 is the output signal 402 of the auxiliary oscillator circuit 170. Further, the FSM 404 controls the switch circuit 133 to couple the suppression circuit 130 to the crystal resonator 110. Accordingly, the crystal resonator 110 starts to only resonate at the overtone resonance frequency such that also the output signal 401 of the shaper circuit 160 is now at the overtone resonance frequency.

The FSM 406 transitions from off-state to a start-up state for activating the frequency divider circuit 180 while the FSM 404 is in the transition mode. Upon activation, the frequency divider circuit 180 starts to settle for frequency dividing the output signal 401 of the shaper circuit 160. Once the frequency divider circuit 180 operates nominally (has settled), the FSM 404 transitions from the transition mode to the second operation mode at a time instant C. Further, the FSM 406 transitions from the start-up state to a nominal operation state.

When in the second operation mode, the FSM 404 controls the multiplexer 190 to couple the first output terminal 150 to the frequency divider circuit 180 such that the first output signal 151 is the output signal 403 of the frequency divider circuit 180. The output signal 402 of the auxiliary oscillator circuit 170 is, hence, no longer needed for providing the first output signal 151. Accordingly, the FSM 405 transitions to a power down state for powering down the auxiliary oscillator circuit 170 and subsequently transitions to the off-state.

Further, the second output signal 156 at the second output terminal 155 is the output signal 401 of the shaper circuit 160. Accordingly, the first output signal 151 and the second output signal 156 may be provided simultaneously in the second operation mode as clock signals.

Transitioning from the second operation mode back to the first operation mode may be done in reverse order.

The proposed clock (oscillation) signal generation may allow to use a crystal quartz resonator on its fundamental tone and its third overtone. Further, a fast transition between low and high clock rates may be achieved. Additionally, changing the native reference frequency of the crystal oscillator 100 may enable improved jitter for the crystal oscillator 100 (higher frequencies suppress noise in the circuitry of the crystal oscillator 100 causing less AM to PM noise conversion and, hence, less noise) such that power and performance optimization may be possible per use case. A fluent and glitch-less transition from the fundamental tone to the (e.g. third) overtone, i.e. clock continuity, may further be enabled.

According to examples, the proposed clock (oscillation) signal generation may, e.g., allow to use a third overtone crystal resonator instead of a resonator exhibiting the same frequency as fundamental resonance frequency. This may be advantageous since the third overtone crystal resonator allows to generate a clock signal at the high third overtone resonance frequency and since the third overtone crystal resonator is cheaper than a resonator exhibiting the same frequency as fundamental resonance frequency.

The above described performance on demand operability may allow power optimization per required clock rate and better power KPIs for legacy low clock rate modes. Further, as can be seen from FIG. 4, no clock blanking periods occur during reference clock frequency transition (i.e. when changing from the first operation mode to the second operation mode, and vice versa). Further, the proposed technique has substantially no current consumption impact compared to legacy XO designs due to the hardware add-on mechanisms. The ability of the propose technique to operate on a higher native clock frequency may remove the need for dedicated Phase-Locked Loops (PLLs) for generating higher clock rates and, hence, save power. Further, the proposed technique may be compatible to devices not supporting (e.g. third) overtones.

Figure 5:
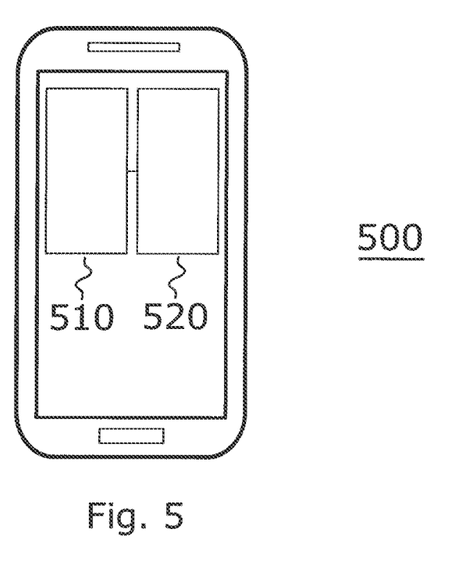
FIG. 5 illustrates an example of a mobile device.

An example of a battery powered electronic device using clock (oscillation) signal generation according to one or more aspects of the proposed technique or one or more examples described above is illustrated in FIG. 5. FIG. 5 schematically illustrates an example of a mobile device 500 (e.g. mobile phone, smartphone, tablet-computer, or laptop) comprising a crystal oscillator 510 as proposed and at least one electronic circuit 520 coupled to the crystal oscillator 510.

For example, the electronic circuit 520 may be a transmitter, a receiver or an application processor.

The mobile device 500 may comprise further elements using clock signals provided by the crystal oscillator 510 such as, e.g., a baseband processor, memory, an audio driver, a camera driver, a touch screen, a display driver, sensors, removable memory, a power management integrated circuit or a smart battery.

To this end, a mobile device using a frequency-on-demand crystal oscillator may be provided.

The above wireless communication circuits using clock signal generation according to the proposed technique or one or more of the examples described above may be configured to operate according to one of the 3$^{rd}$ Generation Partnership Project (3GPP)-standardized mobile communication networks or systems. The mobile or wireless communication system may correspond to, for example, a 5$^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a WidebandCDMA (WCDMA) network, a Frequency Division Multiple Access (FDMA) network, a Spatial Division Multiple Access (SDMA) network, etc.

It is to be noted that the proposed clock signal generation technique is not limited to usage in wireless communication circuits. In general, the proposed clock signal generation technique may be used for clock signal generation in any electronic device. The electronic device may in general be a mobile device or a stationary device, a battery powered device or stationary powered device, comprise communication circuitry or not, etc.

The examples as described herein may be summarized as follows:

Example 1 is a crystal oscillator, comprising: a crystal resonator comprising a pair of terminals and being capable of oscillating at a fundamental resonance frequency and at least one overtone resonance frequency; an inverter circuit coupled between the pair of terminals; a suppression circuit configured to suppress oscillation of the crystal resonator at the fundamental resonance frequency; and a control circuit configured to control a switch circuit for selectively coupling the suppression circuit to the crystal resonator.

Example 2 is the crystal oscillator of example 1, wherein the control circuit is configured to control the switch circuit to decouple the suppression circuit from the crystal resonator in a first operation mode and to couple the suppression circuit to the crystal resonator in a second operation mode.

Example 3 is the crystal oscillator of example 2, further comprising: a first output terminal coupled to the inverter circuit and configured to output a first oscillation signal based on an output of the inverter circuit during the first operation mode; and a second output terminal coupled to the inverter circuit and configured to output a second oscillation signal based on the output of the inverter circuit during the second operation mode.

Example 4 is the crystal oscillator of example 3, further comprising: an auxiliary oscillator circuit tuned to the fundamental resonance frequency, wherein, prior to entering a transition mode for transitioning between the first operation mode and the second operation mode, the control circuit is further configured to activate the auxiliary oscillator circuit, and wherein the first output terminal is configured to output the first oscillation signal based on an output of the auxiliary oscillator circuit during the transition mode.

Example 5 is the crystal oscillator of example 4, wherein the auxiliary oscillator circuit is stably aligned to the output of the inverter circuit when entering the transition mode.

Example 6 is the crystal oscillator of example 4 or example 5, wherein the auxiliary oscillator circuit is a ring oscillator.

Example 7 is the crystal oscillator of any of examples 4 to 6, further comprising: a frequency divider circuit configured divide a frequency of a signal input to the frequency divider circuit by the ratio of the overtone resonance frequency to the fundamental resonance frequency, wherein the frequency divider circuit is configured to receive the output of the inverter circuit, wherein, prior to entering the second operation mode from the transition mode, the control circuit is further configured to activate the frequency divider circuit, wherein the control circuit is further configured to deactivate the auxiliary oscillator circuit as soon as the frequency divider circuit operates nominally, and wherein the first output terminal is configured to output the first oscillation signal based on an output of the frequency divider circuit instead of the output of the auxiliary oscillator circuit as soon as the frequency divider circuit operates nominally.

Example 8 is the crystal oscillator of any of examples 4 to 7, wherein, when entering the first operation mode from the transition mode, the control circuit is further configured to deactivate the auxiliary oscillator circuit.

Example 9 is the crystal oscillator of any of examples 4 to 8, further comprising: a multiplexer circuit coupled to the first output terminal, wherein the control circuit is configured to control the multiplexer circuit to selectively couple the first output terminal to one of the inverter circuit, the auxiliary oscillator circuit and the frequency divider circuit.

Example 10 is the crystal oscillator of any of examples 1 to 9, wherein the suppression circuit is configured to shunt signal components output by the crystal resonator at the fundamental resonance frequency to ground.

Example 11 is the crystal oscillator of example 10, wherein the suppression circuit comprises an inductive element and a capacitive element coupled between the switch circuit and ground.

Example 12 is the crystal oscillator of any of examples 1 to 11, further comprising a first capacitive element coupled between ground and a first one of the pair of terminals, and a second capacitive element coupled between ground and a second one of the pair of terminals.

Example 13 is the crystal oscillator of example 12, wherein a capacitance of at least one of the first capacitive element and the second capacitive element is adjustable.

Example 14 is the crystal oscillator of any of examples 1 to 13, wherein the at least one overtone resonance frequency is the third overtone resonance frequency.

Example 15 is the crystal oscillator of any of examples 1 to 14, further comprising: a shaper circuit capacitively coupled to the inverter circuit and configured to rectify an output of the inverter circuit so that circuitry downstream of the shaper circuit receives the rectified output of the inverter circuit.

Example 16 is an electronic device, comprising: a crystal oscillator according to any of examples 1 to 15; and at least one electronic circuit coupled to the crystal oscillator.

Example 17 is the electronic device of example 16, wherein the electronic device is battery powered.

Example 18 is the electronic device of example 16 or example 17, wherein the electronic device is a mobile device.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A crystal oscillator, comprising:
   a crystal resonator comprising a pair of terminals and being capable of oscillating at a fundamental resonance frequency and at least one overtone resonance frequency;
   an inverter circuit coupled between the pair of terminals;
   a suppression circuit configured to suppress oscillation of the crystal resonator at the fundamental resonance frequency; and
   a control circuit configured to control a switch circuit for selectively coupling the suppression circuit to the crystal resonator,
   wherein the suppression circuit is configured to shunt signal components output by the crystal resonator at the fundamental resonance frequency to ground.

2. The crystal oscillator of claim 1, wherein the control circuit is configured to control the switch circuit to decouple the suppression circuit from the crystal resonator in a first operation mode and to couple the suppression circuit to the crystal resonator in a second operation mode.

3. The crystal oscillator of claim 2, further comprising:
   a first output terminal coupled to the inverter circuit and configured to output a first oscillation signal based on an output of the inverter circuit during the first operation mode; and
   a second output terminal coupled to the inverter circuit and configured to output a second oscillation signal based on the output of the inverter circuit during the second operation mode.

4. The crystal oscillator of claim 3, further comprising:
   an auxiliary oscillator circuit tuned to the fundamental resonance frequency,
   wherein, prior to entering a transition mode for transitioning between the first operation mode and the second operation mode, the control circuit is further configured to activate the auxiliary oscillator circuit,
   and wherein the first output terminal is configured to output the first oscillation signal based on an output of the auxiliary oscillator circuit during the transition mode.

5. The crystal oscillator of claim 4, wherein the auxiliary oscillator circuit is stably aligned to the output of the inverter circuit when entering the transition mode.

6. The crystal oscillator of claim 4, wherein the auxiliary oscillator circuit is a ring oscillator.

7. The crystal oscillator of claim 4, further comprising:
   a frequency divider circuit configured divide a frequency of a signal input to the frequency divider circuit by the ratio of the overtone resonance frequency to the fundamental resonance frequency, wherein the frequency divider circuit is configured to receive the output of the inverter circuit,
   wherein, prior to entering the second operation mode from the transition mode, the control circuit is further configured to activate the frequency divider circuit,
   wherein the control circuit is further configured to deactivate the auxiliary oscillator circuit as soon as the frequency divider circuit operates nominally, and wherein the first output terminal is configured to output the first oscillation signal based on an output of the frequency divider circuit instead of the output of the auxiliary oscillator circuit as soon as the frequency divider circuit operates nominally.

8. The crystal oscillator of claim 4, wherein, when entering the first operation mode from the transition mode, the control circuit is further configured to deactivate the auxiliary oscillator circuit.

9. The crystal oscillator of claim 4, further comprising:
a multiplexer circuit coupled to the first output terminal, wherein the control circuit is configured to control the multiplexer circuit to selectively couple the first output terminal to one of the inverter circuit, the auxiliary oscillator circuit and the frequency divider circuit.

10. The crystal oscillator of claim 1, wherein the suppression circuit comprises an inductive element and a capacitive element coupled between the switch circuit and ground.

11. The crystal oscillator of claim 1, further comprising a first capacitive element coupled between ground and a first one of the pair of terminals, and a second capacitive element coupled between ground and a second one of the pair of terminals.

12. The crystal oscillator of claim 11, wherein a capacitance of at least one of the first capacitive element and the second capacitive element is adjustable.

13. The crystal oscillator of claim 1, wherein the at least one overtone resonance frequency is the third overtone resonance frequency.

14. The crystal oscillator of claim 1, further comprising:
a shaper circuit capacitively coupled to the inverter circuit and configured to rectify an output of the inverter circuit so that circuitry downstream of the shaper circuit receives the rectified output of the inverter circuit.

15. An electronic device, comprising:
a crystal oscillator according to claim 1; and
at least one electronic circuit coupled to the crystal oscillator.

16. The electronic device of claim 15, wherein the electronic device is battery powered.

17. The electronic device of claim 15, wherein the electronic device is a mobile device.

* * * * *